United States Patent [19]

Konrad et al.

[11] 3,820,109

[45] June 25, 1974

[54] CYCLOCONVERTER INTERFACE APPARATUS

[75] Inventors: Charles E. Konrad; Burnette P. Chausse, both of Roanoke, Va.

[73] Assignee: General Electric Company, Salem, Va.

[22] Filed: Jan. 19, 1972

[21] Appl. No.: 218,967

Related U.S. Application Data

[63] Continuation of Ser. No. 556, Jan. 5, 1970, abandoned.

[52] U.S. Cl. ........ 340/347 NT, 235/183, 324/99 D, 328/28, 340/347 AD

[51] Int. Cl. ........................ H03k 13/20, G06g 7/18

[58] Field of Search 324/99 D; 340/347 NT, 347 AD; 235/183, 150.51; 328/127, 28

[56] References Cited

UNITED STATES PATENTS

| | | | |
|---|---|---|---|
| 3,213,376 | 10/1965 | Riordan | 340/347 NT |
| 3,256,426 | 6/1966 | Roth | 340/347 NT |
| 3,322,942 | 5/1967 | Gerard | 340/347 NT |
| 3,439,272 | 4/1969 | Bailey | 340/347 NT |
| 3,484,593 | 12/1969 | Schmoock | 340/347 NT |
| 3,541,320 | 11/1970 | Beall | 340/347 NT |
| 3,566,265 | 2/1971 | Reid | 340/347 NT |
| 3,688,305 | 8/1972 | Goldsworthy | 340/347 NT |

*Primary Examiner*—Felix D. Gruber

*Attorney, Agent, or Firm*—Arnold E. Renner; Harnold H. Green, Jr.

[57] ABSTRACT

A conversion circuit having polarity sensing wherein an input signal is converted into two signals each of which is the inverse of the other. A pair of switches, arranged to conduct these signals selectively, are connected to an integrator which accumulates the voltage of these signals within predetermined limits set by a pair of comparators. Control logic between the comparators and the switches, together with a third comparator producing a binary signal in response to polarity changes of the input signal, cause alternate conduction of the signals and produce a square wave pulse train having a pulse rate proportional to the absolute magnitude of the input signal.

8 Claims, 4 Drawing Figures

INVENTORS.
CHARLES E. KONRAD
BURNETTE P. CHAUSSE

TRUTH TABLE

| CONDI-TIONS | INPUTS | | | OUTPUTS | | | |
|---|---|---|---|---|---|---|---|
| | SGN | PL | NL | CU | CD | SET A | SET B |
| 1 | 0 | 1 | 0 | 1 | 0 | 0 | 1 |
| 2 | 0 | 0 | 1 | 1 | 0 | 1 | 0 |
| 3 | 1 | 1 | 0 | 0 | 1 | 1 | 0 |
| 4 | 1 | 0 | 1 | 0 | 1 | 0 | 1 |
| 5 | 1 | 0 | 0 | 0 | 1 | * | * |
| 6 | 0 | 0 | 0 | 1 | 0 | * | * |

CYCLOCONVERTER INTERFACE APPARATUS

This is a continuation of application Ser. No. 556 filed Jan. 5, 1970 and now abandoned.

BACKGROUND OF THE INVENTION

The present invention relates to an interface circuit used with cycloconverters, particularly to a circuit which converts a voltage signal of varying amplitude and polarity to a pulse train having a pulse rate proportional to the absolute magnitude of the voltage signal and a binary signal responsive to the polarity of the signal. The pulse rate of the signal determines the output frequency of the cycloconverter when applied to the counter of the frequency polyphase power supply of U.S. Pat. No. 3,641,566 issued Sept. 29, 1969, by the assignee of the present invention. The binary signal resulting from the polarity of the input signal provides the means for reversing the counter so that the counter will count up or down depending on the phase sequence of the output of the cycloconverter.

There are many types of analog to digital converters available wherein an analog signal is converted to a pulse train having a pulse rate which is proportional to the amplitude of the analog signal. However, if the analog signal must be of the kind wherein its polarity may instantly change from positive to negative or inversely from negative to positive, many problems arise. For example, saturation of operational amplifiers normally used may occur during polarity change resulting in a malfunction of the control.

In the digital approach of producing a polyphase alternating current reversal of the phases and thereby reversal of direction of relating equipment supplied by the cycloconverter is best performed during the stage of producing the alternating current rather than interchanging of the phases at the point of supply.

SUMMARY OF THE INVENTION

In order to provide this possibility the present invention teaches a means whereby an analog input signal is converted to a pulse train which has a pulse rate proportional to the absolute magnitude of that analog input signal and whereby the polarity of the analog input signal determines the phase sequence of the polyphase alternating current which results from the application of the pulse train and polarizing signal to sine wave generating equipment.

DETAILED DESCRIPTION

Figure 1:
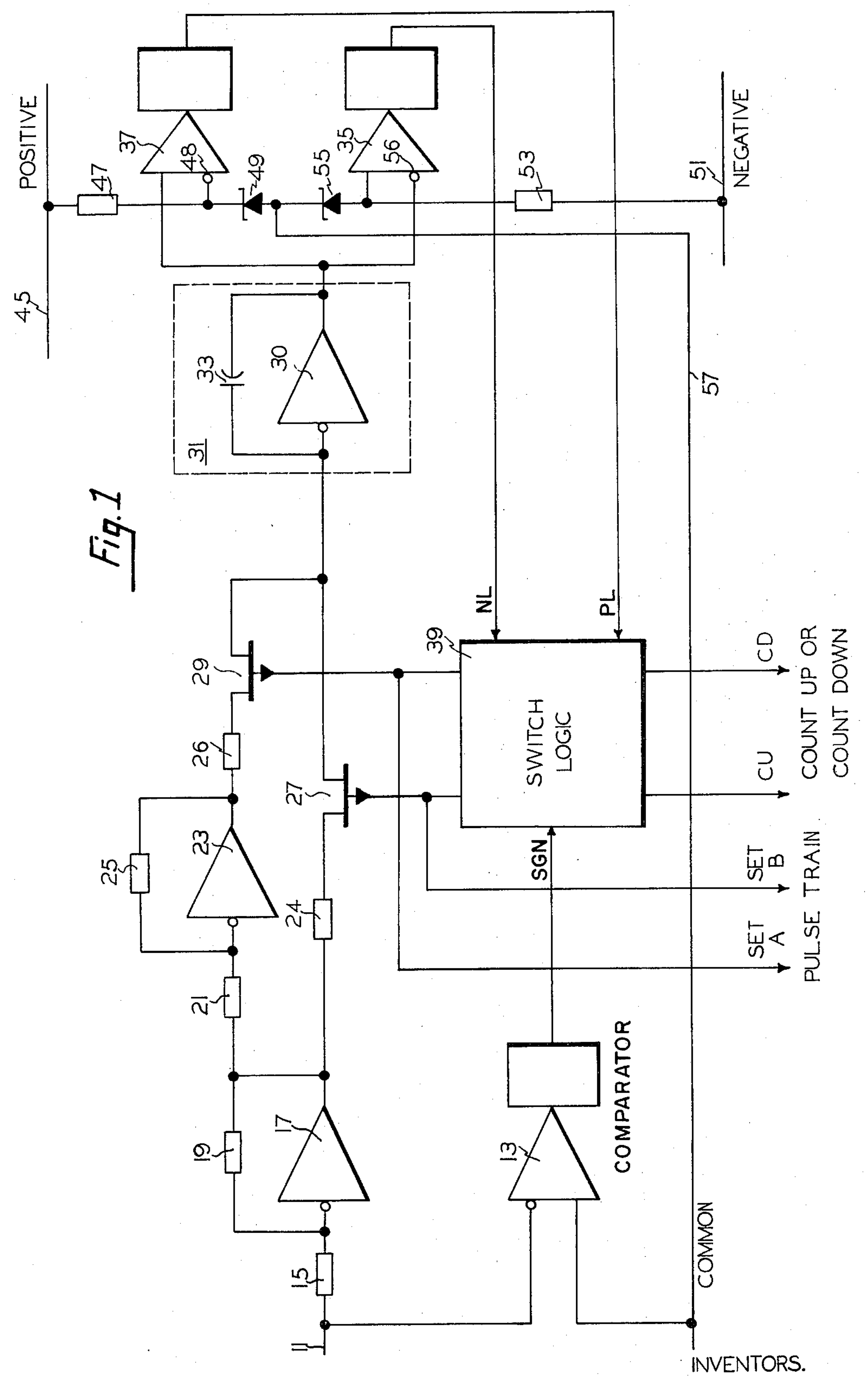
FIG. 1 shows a block diagram at the interface circuitry necessary to provide a pulse train and polarity output signal in response to an analog voltage signal for application to cycloconverter apparatus.

A voltage level input signal 11 is applied to a differential comparator 13 and through a resistor 15 to an operational amplifier 17, having a resistor 19 connected in parallel thereto. Thee output signal of operational amplifier 17 is connected through a resistor 21 to a second operational amplifier 23. A resistor 25 is connected in parallel to the second operational amplifier by having its leads connected to the input and the output connections thereof. The outputs of the two operational amplifiers 17 and 23 are connected respectively through resistors 24 and 26 to the drain connections of a pair of field effect transistors 27 and 29. The source connections of the field effect transistors are connected together and to a summing junction which forms the input of an operational amplifier 30, the latter having a capacitor 33 connected in parallel therewith, thus forming an integrator 31. The output of thee integrator 31 is connected to the inverse input connection of a first differential comparator 35 and the normal connection of a second differential comparator 37 each of which has its output signals applied to a switching logic circuit 39, described later.

This switching logic circuitry 39 provides output signals which are applied to the gates of field effect transistors 27 and 29 and also provides a pulse train for use with the cycloconverter circuitry described in U.S. Pat. No. 3,641,566. A second pair of output connections CU and CD provides signals to associated cycloconverter circuitry for determining the phase relationship of the three phase cycloconverter output.

A positive voltage from bus 45 is applied through resistor 47 to the inverse input connection of differential comparator 37 and to the cathode of Zener diode 49. A negative voltage signal from bus 51 is applied through resistor 53 to the normal input of differential comparator 35 and to the anode of Zener diode 55, which has its cathode connected to the anode of Zener diode 49 and to the common bus 57. A connection is made from the common bus 57 to the normal input connection of the differential comparator 13 which has an output connected to the switching logic circuitry thereby controlling through the switching logic circuit 39 the polarity of the output signal of the integrator.

Operation of interface apparatus follows. The input signal may be of either positive or negative polarity; however, for the purpose of explanation assume that this signal is positive which is applied through resistor 15 to the input of operational amplifier 17. The characteristics of an operational amplifier are such that the polarity of the output signal is the inverse of that of the input signal, hence the positive signal applied to the input of operational amplifier will cause a negative output signal to be applied to the drain of field effect transistor 27 and to the input of operational amplifier 23. Operational amplifier 23 inverts the negative signal causing a positive signal to be applied to the drain of field effect transistor 29. The gain (ratio of input to output) of an operational amplifier such as 17 or 23 is determined by the ratio of resistance in series and in parallel with the amplifier, thus the ratio of resistances 15 and 19 determine the gain of amplifier 17. Similarly in the case of operational amplifier 23 the gain is determined by the ratio of the resistance of resistors 21 and 25. The gain of operational amplifier 17 may be any desirable value; however, the function of operational amplifier 23 is to invert the output signal of operational amplifier 17, hence its gain is kept at unity. Therefore, two signals are produced which are opposite in polarity but equal in amplitude. The field effect transistors 27 and 29 are alternately caused to conduct through signals applied to their gates by the switching logic circuitry, thus when a voltage signal is applied to the gate of field effect transistor 27 it is caused to conduct, while field effect transistor 29 is blocking. Similarly, when a voltage signal is applied to the gate of field effect transistor 29 it will conduct while field effect transistor 27 is blocking. Thus only one of the field effect transistors will conduct at one time as determined by the switching logic circuitry 39. Assume now that field effect transistor 27 is conducting thereby causing a negative voltage signal to be applied to the input of integrator 31. The integrator having inverting characteristics produces an output signal which is increasing in magnitude and is positive in polarity.

Zener diode 49 causes a predetermined positive level of voltage to exist at the inverse input terminal 48 of differential comparator 37, while in a similar manner Zener diode 55 causes a predetermined negative level of voltage to be applied to the normal input of differential comparator 35.

A differential comparator compares the voltage signal applied to one of its input connections with the voltage applied to a second input connection and produces a binary ONE when the inverting input (symbolized by a small circle) is negative with respect to the non-inverting or normal input. Thus the Zener diodes 49 and 55 apply signals to one of the input connections of each of differential comparators 35 and 37 of a predetermined amplitude. The voltage signal applied to the other input terminal of each of the differential comparators 35 and 37 by integrator 31 is then compared to the Zener diode output. When the integrator output exceeds the voltage level set by Zener diodes 49 and 55, an output signal results from one of the differential comparators. Since differential comparator 37 determines the limit of the positive voltage output of integrator 31 and differential comparator 35 determines the negative voltage limit of the integrator 31 output, signals will be produced whenever the voltage level of the output signal from the integrator exceeds the voltage level set by the Zener diodes at both the negative or positive ends of the range of the integrator output. Assume that the voltage applied to the inverse connection of differential comparator 37 is 8 volts positive. When the voltage applied to the normal connection thereof by the output of integrator 31 exceeds this 8 volt level the differential comparator will produce a signal as long as this condition exists. Similarly the input to the normal input connection of differential comparator 35 may be assumed to be 8 volts negative hence when the voltage level applied to the inverse input connection of the comparator exceeds this −8 volt level the comparator produces an output signal. The signals produced are in the form of a pulse having a duration which equals the period during which the output of the integrator exceeds the +8 volt or −8 volt level. These two output signals are then applied to input connections of the switching logic circuitry 39 which supplies input signals to the gates of field effect transistors 27 and 29 in response thereto. Thus with reference to the original example where field effect transistor 27 is conducting current to the input of integrator 31, switching of the signals applied to the field effect transistors 27 and 29 will cause transistor 27 to halt conducting current and will cause field effect transistor 29 to start conduction. Since the voltage applied to the integrator 31 was negative in polarity being conducted from operational amplifier 17 through field effect transistor 27 the change will cause a positive voltage from operational amplifier 23 through field effect transistor 29 to be applied to the input of integrator 31. As the voltage integrated in integrator 31 exceeds a predetermined negative value, differential comparator 35 will be caused to produce a pulse which, when applied to switching logic circuitry, results in a change in state of each of the field effect transistors 27 and 29 thereby causing the polarity of the voltage signal applied to the integrator 31 to be negative. The frequency at which this switching occurs is a function of the time required for the voltage level to integrate to the predetermined level set by the Zener diodes 49 and 55. It is therefore obvious that an increase of input voltage will cause this time to be reduced resulting in an increase in the frequency of the switching function. Hence, a change in the magnitude of input voltage signal will provide a change in the frequency of the output pulse train from each of output connections 61 andd 63.

Figure 2:
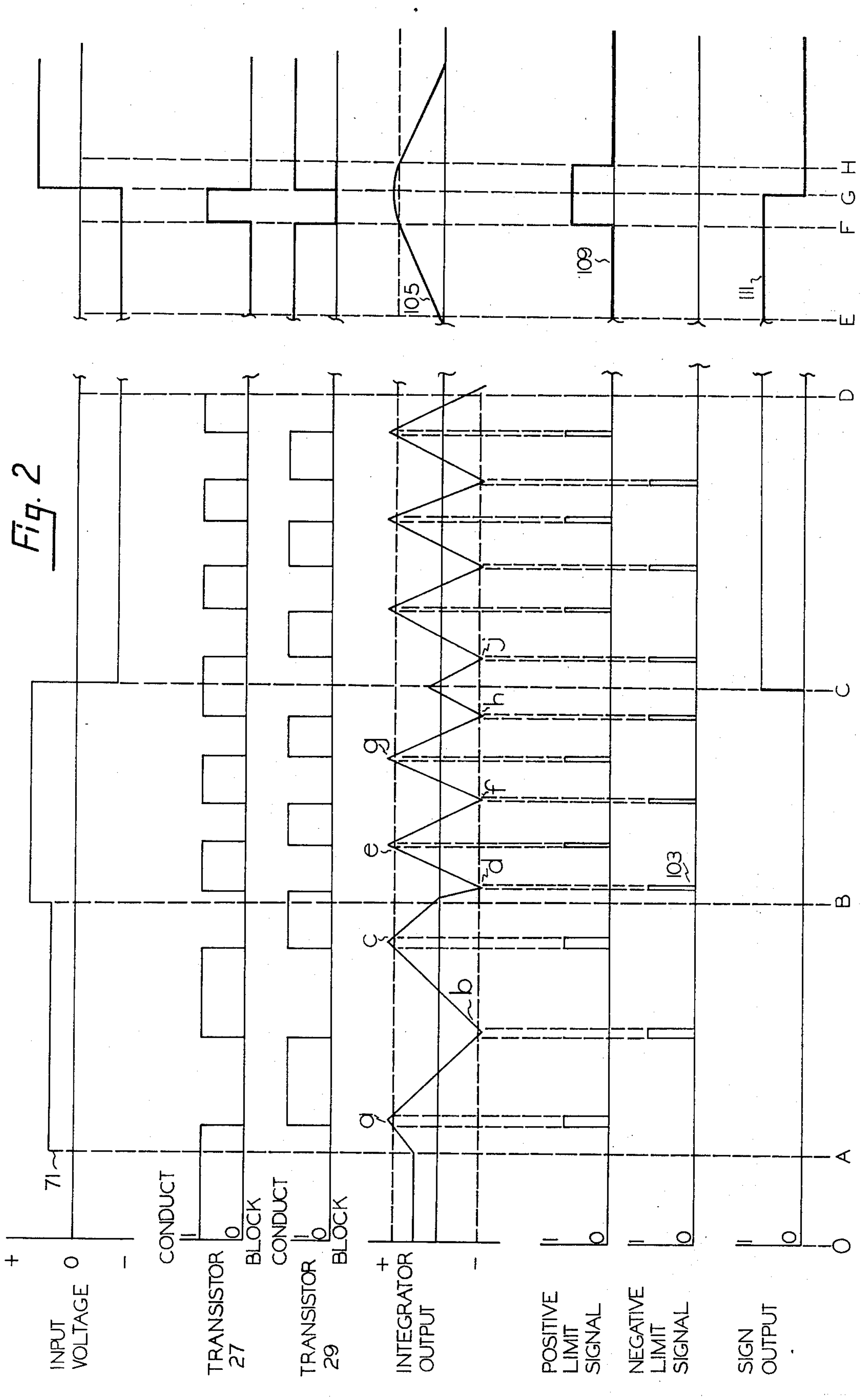
FIG. 2 is a graph showing voltage levels of the various input and output signals used in the interface circuitry.

Refer now to FIGS. 1 and 2. FIG. 2 shows the variations in input voltage, the change in state of field effect transistors 27 and 29, the variations in output voltage of the integrator, the pulses produced by differential comparators 35 and 37, and the variations in output signal of the differential comparator 13, titled sign output. Along the bottom edge of the graph letters "A" – "H" denote the point in time in which the following events occur. Thus for example at zero time the graph shows that the input voltage is zero and field effect transistor 27 is conducting while field effect transistor 29 is in the blocking state. The integrator has accumulated a predetermined voltagee level but since no voltage is applied thereto the accumulation remains constant for a period of time.

At point in time "A," an input signal of predetermined positive voltage 71 is applied to the input connection. The integrator is caused to accumulate the voltage, which reaches a predetermined positive value set by the Zener diode 55 at point "a." As soon as the level of the voltage signal exceeds the predetermined voltage level as set by Zener diode 55, a pulse from positive limit comparator 35 is applied to the switching logic circuitry 39. This pulse is shown to continue for the interval during which the output voltage of the integrator exceeds the preset value. Signals from switching logic circuitry 39 applied to the gates of field effect transistors 27 and 29 cause a change in state thereof, hence transistor 27 switches to block the current while simultaneously transistor 29 is switched to conduct the current. The voltage output of the integrator now accumulates negatively until it exceeds the negative voltage limit set by comparator 37 at point in time "*b*." This results in the production of a pulse signal by differential comparator 37 which when applied to the switching logic circuitry 39 again causes a change in state of the field effect transistors. The pulse produced by the comparator 37 is shown to last for the duration that the integrator voltage exceeds the predetermined voltage level set by Zener diode 49. The change in state of transistors 27 and 29 causes the integrator to produce a positive output signal which reaches the predetermined maximum value at point in time "c."

The speed at which integration of the voltage input signal occurs depends on the amplitude of the input signal hence when the voltage of the input signal is increased as is shown at point in time "B" the integrator output is caused to reach the predetermined maximum voltage level faster. At point in time "*d*" the voltage level exceeds the negative limit which causes a pulse 103 to be applied to the switching logic circuitry 39 resulting in a change in state of field effect transistors 27 and 29. Transistor 27 now conducts a positive voltage to the input of integrator 31 resulting in a repetition of the functions described above. The frequency of switching now however is increased as is shown by the decrease in space between points in time "e"–"h."

At point in time "C" the polarity of the input signal is changed as shown, the amplitude of the signal is equal but polarity is now negative. At the time of the change field effect transistor 27 is conducting and transistor 29 is blocking. Since the polarity of the input signal is inverted the output of the integrator 31 is inverted, resulting in a negative output signal. When the voltage level exceeds the negative limit differential comparator 37 produces a pulse which causes switching logic circuit 39 to invert the functions of field effect transistors 27 and 29 as shown at point in time "j." The change in polarity from positive to negative causes the sign output signal to go from zero volts to a predetermined value. This signal produced by comparator 13 assures the proper operation of the switching logic under special conditions as follows.

For example assume that, as shown in point in time "E," the integrator 31 is producing a positive signal 105, field effect transistor 29 is conducting and input voltage is negative. At point in time "F" the output voltage of the integrator 31 has reached the predetermined positive voltage level and when exceeding this causes the positive voltage limit signal 109 to switch field effect transistor 29 to a non-conducting state and field effect transistor 27 to a conducting state. If at this time the input voltage polarity is changed, that is when the output voltage of the integrator is exceeding the preset positive voltage limit as indicated at point in time "G" the sign output signal 111 goes to zero volts causing the switching logic circuit to change the state of field effect transistors 27 and 29 so that field effect transistor 29 now conducts and field effect transistor 27 blocks the voltage applied to the integrator. The polarity of the signal applied to the integrator was thereby reversed. If this switching function had not occurred the voltage output of the integrator which tended to go negative would be inverted at the time the polarity of the input signal was changed so that it would continue to go positive. This would result in a voltage level beyond the capacity of the integrator which would under these conditions saturate. The switching logic circuitry however causes the field effect transistors to change state and the output of the integrator to be negative.

Figures 3, 4:
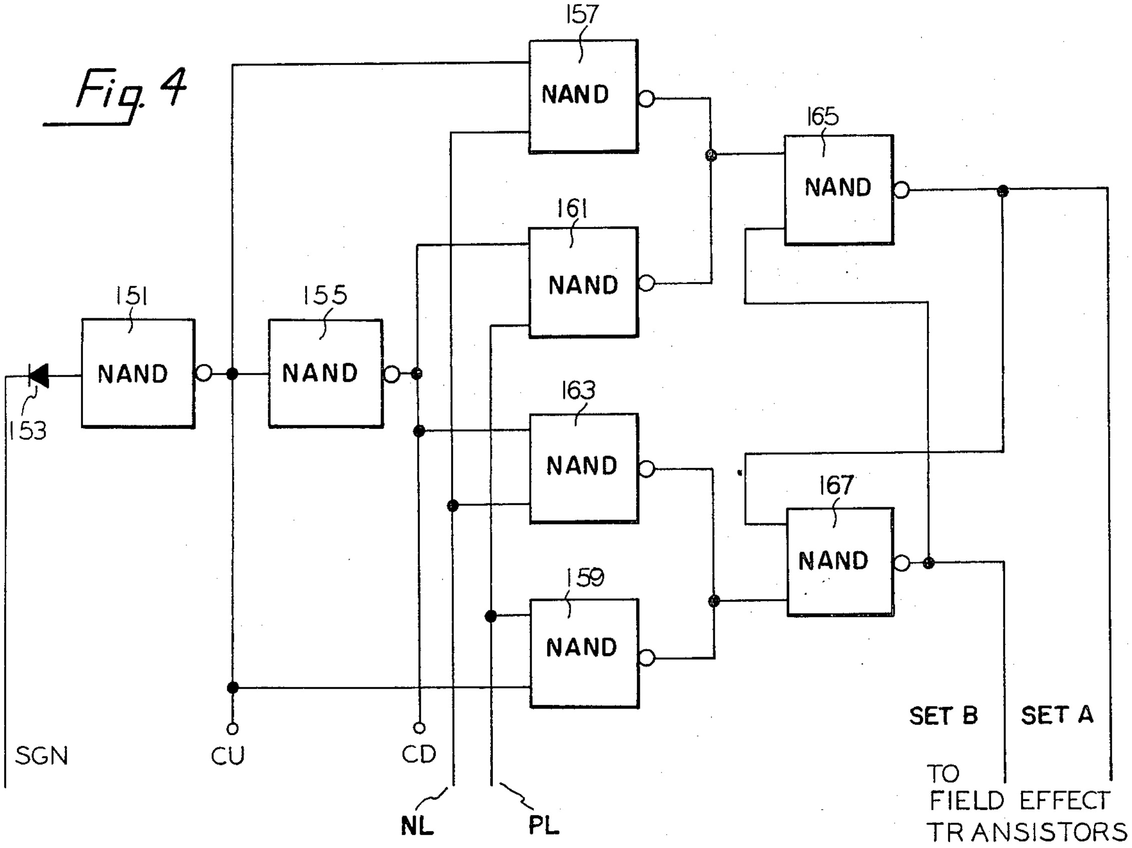
FIG. 3 shows a truth table of the digital input and output signals resulting in the various stages of the interface circuit.
FIG. 4 is a diagram showing detail circuit connections of the switching logic block in FIG. 1.

Refer now to FIG. 3 showing a truth table of the various signals generated to a series of input signals to switching logic circuitry 39. The input signals comprise the sign signal SGN, resulting from the output of comparator 13; the positive limit signal PL; the output signal of comparator 35; and the negative limit signal NL, resulting output of comparator 37.

The output signals of the switching logic circuit 39 are the count up signal CU and the count down signal CD. These signals regulate the phase sequence relation of the cycloconverter. In addition thereto two other signals SET A and SET B, the inverse of each other, result from the various input signals to the switching logic circuit and control the state of field effect transistors 27 and 29.

Refer now to FIGS. 2 and 3. When the sign output from comparator 13 is negative, represented by a binary ZERO in condition 1 of the truth table, and the positive limit is at a predetermined level indicated by a binary ONE in the truth table, the switching logic circuit produces a count up signal CU as indicated by a binary ONE in the truth table and a SET B signal indicated by a binary ONE signal. The SET B signal causes field effect transistor 27 to conduct. The binary ZERO value of the SET A signal indicates that field effect transistor 29 is in a blocking state.

Condition 2 shows a binary ZERO signal sign output of comparator 13 and a binary ONE signal NL resulting from the integrator 31 output reaching its negative limit and producing a signal from comparator 37, a count up signal CU is produced by the switching logic circuit and a SET A signal causes field effect transistor 29 to conduct. The binary ZERO under SET B shows that field effect transistor 27 is now blocking.

If the polarity of the input signal 11 is changed as presented in condition 3 resulting in a binary ONE output signal from comparator 13 shown in the SGN column, and the positive limit comparator produces a binary ONE signal under PL, the output of the logic switching circuit causes a binary ONE from the count down output CD and a binary ONE signal on the SET A output connection.

As the voltage of the integrator reaches the negative limit shown in condition 4 a binary ONE signal is applied to the switching logic circuit which with all other conditions unchanged will produce a SET B signal causing field effect transistor 27 to conduct. While the voltage output of the integrator 31 is between the positive and negative limits as shown in condition 5, and a binary ONE signal produced by comparator 13 is applied to the switching logic circuit 39 a binary ZERO signal is present on the count up output CU, a binary ONE signal is present on the count down connection CD and no SET signals are generated so that no change in state of the transistors 27 and 29 is caused.

If now the input signal 11 polarity is changed to produce a binary ZERO signal from comparator 13 represented in condition 6, the count up output CU connection of the switching logic circuit 39 produces a binary ONE signal and the count down output CD produces a binary ZERO signal no changes in the state of field effect transistors 27 and 29 occur since no SET A and SET B signals are generated as shown by the asterisks in those columns of the truth table.

Thus, six possible conditions of output signals in response to input signals are shown in the truth table. Changes in voltage level of the input signal are shown abrupt to give the appearance of digital changes; however, gradual changes of the input signal result in similar instant output signals from the comparators due to the design of these apparatuses.

Refer now to FIG. 4 giving a detailed view of the switching logic circuitry 39 shown in FIG. 1. The logic blocks shown are NAND functions wherein a binary ONE signal applied to each of the two input connections produces a binary ZERO output signal. If only one input connection exists, a binary ZERO applied thereto produces a binary ONE output signal and inversely a binary ONE input produces a binary ZERO output. For all other conditions of input signals a binary ONE output signal is produced. Thus, when NAND circuit 151 receives a binary ZERO signal througgh diode 153 from the sign comparator 13 (FIG. 1), it produces a binary ONE output signal. This signal is applied to the count up connection CU and to the input of a NAND circuit 155 and to one of two input connections of NAND circuits 157 and 159.

The binary ONE input signal applied to NAND circuit 155 is inverted thereby causing a binary ZERO signal to be applied to NAND circuits 161 and 163. The output of NAND circuit 155 forms the count down connection CD of the switching logic circuit.

Input connections NL and PL are applied to NAND circuits 163, 157 and 159, 161 respectively, hence if for example the NL signal is a binary ZERO, which is applied to input connections of NAND circuits 157 and 163, each of these NAND circuits will produce a binary ONE signal.

When the NL input signal is a binary ZERO, the PL signal is a binary ONE which when applied to NAND circuits 159 and 161 causes circuit 161 to produce a binary ONE signal and since NAND circuit 159 has two binary ONE signals applied thereto this circuit will produce a binary ZERO output.

The output connections of NAND circuits 159 and 163 are connected together and to one input connection of NAND circuit 167. Similarly the output connections of NAND circuits 157 and 161 are connected together and to the input connection of NAND circuit 165. In the example, NAND circuit 163 produces a binary ONE signal while connected to the output connection of NAND circuit 159 which produces a binary ZERO signal. NAND logic circuitry operates in such a manner that where such condition described above exists the binary ZERO signal is dominant so that in the example a binary ZERO signal is applied to the input of NAND circuit 167. Each of NAND circuits 161 and 157 produces a binary ONE signal which is applied to NAND circuit 165.

NAND circuits 165 and 167 are cross-connected; i.e., the output signal of NAND circuit 165 is connected to the input of NAND circuit 167 and inversely the output signal of NAND circuit 167 is applied to the input of NAND circuit 165. Since NAND circuit 167 has at least one input signal consisting of a binary ZERO it will produce a binary ONE output signal which is applied to the input of NAND circuit 165. This circuit which already has one binary ONE signal applied thereto will with the addition of the second binary ONE signal produce a binary ZERO output signal.

The binary ZERO output signal from NAND circuit 165 and the binary ONE signal from NAND circuit 167 are applied to the gates of field effect transistors 29 and 27 (FIG. 1) respectively (signals SET A and SET B, respectively thereby accomplishing the polarity switching of the integrator 31 output signal.

While the invention has been explained and described with the aid of particular embodiments thereof, it will be understood that the invention is not limited thereby and that many modifications retaining and utilizing the spirit thereof without departing essentially therefrom will occur to those skilled in the art in applying the invention to specific operating environments aand conditions. It is therefore contemplated by the appended claims to cover all such modifications as fall within the scope and spirit of the invention.

What is claimed is:

1. A cycloconverter interface circuit having an input signal of varying amplitude and polarity, comprising:

a. means for scaling the input signal and converting said scaled signal into first and second gate signals of equal amplitude and of opposite polarity;

b. first and second switching means for selectively conducting respectively said first and second gate signals;

c. an integrator connected to the output of said first and second switching means for producing an alternating voltage signal which is the time-integral of the gate signal appliedd thereto;

d. means responsive to the output of said integrator for producing a first switching signal each time said alternating voltage signal has reached a predetermined positive value and a second switching signal each time said alternating voltage signal has reached a predetermined negative value; and e. logic means responsive to said first and second switching signals to selectively actuate said first and second switching means to reverse the gate signal polarity applied to said integrator and further responsive to a change in polarity of the input signal to actuate said switching means to change the gate signal applied to said integrator when either of said switching signals is present to produce a square wave pulse train having a pulse rate proportional to the absolute magnitude of the input signal.

2. The invention claimed in claim 1 wherein said scaling and converting means comprises first and second operational amplifiers connected in series and in which said second operational amplifier has unity gain and inverts the output signal of said first operational amplifier.

3. The invention claimed in claim 1 wherein said switching means comprises solid state control.

4. The invention claimed in claim 3 wherein said switching means includes a pair of field effect transistors.

5. The invention claimed in claim 1 wherein said means responsive to the output of the integrator comprises a pair of comparator circuits.

6. The invention claimed in claim 5 wherein the comparator circuits compare the output of said integrator to the voltages set by a pair of Zener diodes.

7. The invention claimed in claim 6 wherein said Zener diodes are connected such that one provides a positive voltage level and the other provides a negative level of voltage for comparison by said comparator circuits.

8. The invention claimed in claim 1 wherein said logic means includes a plurality of interconnected logic function circuits operable, when said input signal is of a first polarity, to render said first and second switching means conductive in response, respectively, to said first and second switching signals and to render, when said input signal is of a second polarity, said first and second switching means conductive in response, respectively, to said second and first switching signals.

* * * * *

UNITED STATES PATENT AND TRADEMARK OFFICE

CERTIFICATE OF CORRECTION

PATENT NO. : 3,820,109

DATED : June 25, 1974

INVENTOR(S) : Charles E. Konrad and Burnette P. Chausse

It is certified that error appears in the above-identified patent and that said Letters Patent are hereby corrected as shown below:

Column 1, line 16, cancel "Sept. 29, 1969, by" and substitute --February 8, 1972, assigned to--.

Column 2, line 1, cancel "Thee" and substitute --The--.
line 7, after "connected" insert a comma --,--.
line 8, after "tively" insert a comma --,--.
line 14, cancel "thee" and substitute --the--.

Column 4, line 20, cancel "andd" and substitute --and--.
line 33, cancel "voltagee" and substitute --voltage--.

Column 7, line 2, cancel "througgh" and substitute --through--.
line 55, after "spectively" insert a parenthesis --)--.
line 64, cancel "aand" and substitute --and--.

Column 8, line 15, cancel "appliedd" and substitute --applied--.

Signed and Sealed this

*twenty-seventh* Day of *April 1976*

[SEAL]

*Attest:*

RUTH C. MASON
*Attesting Officer*

C. MARSHALL DANN
*Commissioner of Patents and Trademarks*